United States Patent
Lilge

(10) Patent No.: US 10,535,910 B2
(45) Date of Patent: Jan. 14, 2020

(54) HIGH FREQUENCY CONNECTION INCLUDING FIRST AND SECOND HIGH FREQUENCY CONNECTORS CONNECTED BY A TWO SECTION DIELECTRIC COUPLING SLEEVE

(71) Applicant: Phoenix Contact GmbH Co. KG, Blomberg (DE)

(72) Inventor: Martin Lilge, Horn-Bad Meinberg (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 15/525,806

(22) PCT Filed: Oct. 16, 2015

(86) PCT No.: PCT/EP2015/074000
§ 371 (c)(1),
(2) Date: May 18, 2017

(87) PCT Pub. No.: WO2016/074882
PCT Pub. Date: May 19, 2016

(65) Prior Publication Data
US 2018/0138573 A1    May 17, 2018

(30) Foreign Application Priority Data
Nov. 14, 2014 (DE) .......................... 10 2014 116 724

(51) Int. Cl.
*H01P 5/02* (2006.01)
*H01R 24/42* (2011.01)
(Continued)

(52) U.S. Cl.
CPC .............. *H01P 5/026* (2013.01); *H01P 1/045* (2013.01); *H01R 24/42* (2013.01); *H01R 24/542* (2013.01);
(Continued)

(58) Field of Classification Search
CPC .................................. H01P 5/026; H01P 1/045
(Continued)

(56) References Cited

U.S. PATENT DOCUMENTS 2,743,422 A * 4/1956 Muchmore ............ H01B 11/18
                                                              333/244
5,969,684 A    10/1999 Oh et al.
(Continued)

FOREIGN PATENT DOCUMENTS

DE     79 26 745 U1    7/1980
DE     103 28 881 B3    1/2005
(Continued)

OTHER PUBLICATIONS

ISA/EP International Search Report, Int'l Application No. PCT/EP2015/074000, Jan. 13, 2016, European Patent Office, HV Rijswijk, NL, 25 pgs.

*Primary Examiner* — Benny T Lee
(74) *Attorney, Agent, or Firm* — Holland & Hart LLP

(57) ABSTRACT

The present disclosure relates to a dielectric coupling sleeve configured to capacitively couple a first electrical conductor to a second electrical conductor. The dielectric coupling sleeve includes a first sleeve section and a second sleeve section. The first sleeve section has a first diameter. A receiving space is closed on one side and formed in the first sleeve section. The receiving section is configured to receive an insertion of the first electrical conductor. The second sleeve section has a second diameter. The second diameter is smaller than the first diameter. The second sleeve section is configured for insertion into the conductor cavity of the second electrical conductor.

10 Claims, 5 Drawing Sheets

(51) Int. Cl.
     *H01P 1/04*      (2006.01)
     *H01R 24/54*     (2011.01)
     *H03H 7/01*      (2006.01)
     *H01R 103/00*    (2006.01)

(52) U.S. Cl.
     CPC ....... *H03H 7/0138* (2013.01); *H01R 2103/00* (2013.01)

(58) Field of Classification Search
     USPC .............................................. 333/24 C, 245
     See application file for complete search history.

(56) References Cited

U.S. PATENT DOCUMENTS

| | | | |
|---|---|---|---|
| 8,115,574 B2 * | 2/2012 | Adkins | H01P 1/202 333/207 |
| 2009/0009271 A1 * | 1/2009 | McKay | H01P 1/202 333/245 |
| 2014/0134876 A1 | 5/2014 | Vaccaro et al. | |

FOREIGN PATENT DOCUMENTS

| | | |
|---|---|---|
| DE | 10 2005 034 497 A1 | 2/2007 |
| DE | 10 2009 031 373 A1 | 1/2011 |

\* cited by examiner

HIGH FREQUENCY CONNECTION INCLUDING FIRST AND SECOND HIGH FREQUENCY CONNECTORS CONNECTED BY A TWO SECTION DIELECTRIC COUPLING SLEEVE

CROSS-REFERENCE TO RELATED APPLICATIONS

This application is a 371 national phase filing of International Application No. PCT/EP2015/074000, entitled "DIELECTRIC COUPLING SLEEVE", filed 16 Oct. 2015, which claims priority to German Patent Application No. 10 2014 116 724.4, entitled "DIELEKTRISCHE KOPPELHÜLSE", filed 14 Nov. 2014.

BACKGROUND

The present relates to a dielectric coupling sleeve.

A direct current (DC) separator such as a DC Block or an antenna barrier is frequently arranged between an antenna and a radio module in order to filter DC components out of an electrical signal transmitted between the antenna and the radio module. A capacitor intricately soldered onto a circuit board as a surface-mount device (SMD) capacitor or a conventionally wired capacitor is frequently used as a DC separator. If the antenna and the radio module are connected by a coaxial cable, a coaxial DC separator is frequently used, in which the capacitor soldered onto the circuit board is electroconductively connected to inner conductors or outer conductors of two high frequency connectors of the DC separator in a complex soldering process.

SUMMARY OF THE INVENTION

The task on which the disclosure is based is that of specifying an efficient concept for the capacitive coupling of two electrical conductors.

The subject matter solves this task by means of the features of the claims Advantageous examples of the disclosure constitute the subject matter of the figures, the description and the claims.

According to a first aspect of the disclosure, the task is solved by a dielectric coupling sleeve for the capacitive coupling of a first electrical conductor to a second electrical conductor, wherein the second electrical conductor has a conductor cavity comprising: a first sleeve section having a first diameter, wherein a receiving space closed on one side is formed in the first sleeve section into which the first electrical conductor can be inserted; and a second sleeve section having a second diameter, wherein the second diameter is smaller than the first diameter, and wherein the second sleeve section can be inserted into the conductor cavity, and this first aspect achieves the advantage of being able to capacitively couple the first electrical conductor and the second electrical conductor particularly economically by eliminating a complex soldering process.

The dielectric coupling sleeve can be formed from a dielectric material such as polytetrafluoroethylene (PTFE), polyethylene (PE), polyamide (PA) or ceramic.

The dielectric coupling sleeve is for example a turned part produced by means of a lathe or a milled part produced by a milling machine from Teflon (e.g.,PTFE) or a Teflon isolator. Further, the respective sleeve section and/or the receiving space closed on one side can furthermore have a cylindrical shape, in particular a circular cylindrical shape. The first diameter amounts, for example, to 1 mm, 5 mm, 10 mm, 15 mm or 20 mm, the second diameter to 0.5 mm, 1 mm, 3 mm, 5 mm, 8 mm, 10 mm or 15 mm, and the diameter of the receiving space closed on one side to 0.5 mm, 1 mm, 3 mm, 5 mm, 8 mm, 10 mm or 15 mm. A length of the respective sleeve section can furthermore amount to 5 mm, 10 mm, 15 mm, 20 mm 25 mm, 30 mm or 40 mm.

Each of the electrical conductors can each be an inner conductor of a respective high frequency connector such as a type N-type connector or an SMA-type connector. The respective electrical conductors and the dielectric coupling sleeve can furthermore be pressed or bonded together.

In one advantageous example of the dielectric coupling sleeve, the receiving space closed on one side extends at least partly into the second sleeve section, and this example achieves the advantage of being able to increase a capacity of a capacitor formed by the respective electrical conductor and the dielectric coupling sleeve.

In a further advantageous example of the dielectric coupling sleeve, one end of the second sleeve section is dielectrically closed, and this example achieves the advantage of being able to obtain a galvanic isolation of the respective electrical conductors.

In a further advantageous example of the dielectric coupling sleeve, one end of the second sleeve section is formed in frustoconical, conical or domed shape, and this example achieves the advantage of being able to provide an efficient insertion aid for inserting the dielectric coupling sleeve into the conductor cavity of the second electrical conductor. For example, the end of the second sleeve section is of frustoconical or conical shape and the aperture angle of the end of the second sleeve section amounts to 35°, 40°, 45°, 50°, 55°, 59°, 60°, 65°, 70°, 75°, 80° or 85°.

In a further advantageous example of the dielectric coupling sleeve, the first electrical conductor can be retained in the receiving space closed on one side by frictional connection, and the second sleeve section can be retained in the conductor cavity by frictional connection, and this example achieves the advantage of being able to efficiently connect the dielectric coupling sleeve to the respective electrical conductors.

In a further advantageous example of the dielectric coupling sleeve, the dielectric coupling sleeve is formed as one piece, and this achieves the advantage of being able to particularly efficiently manufacture the dielectric coupling sleeve.

In a further advantageous example of the dielectric coupling sleeve, the dielectric coupling sleeve is formed from polytetrafluoroethylene, polyethylene, polyamide or ceramic, and this example achieves the advantage of being able to have low attenuation of a high frequency signal such as a useful signal transmitted via the dielectric coupling sleeve. The ceramic is, for example, steatite or aluminum oxide.

In a further advantageous example of the dielectric coupling sleeve, the dielectric sleeve exhibits a jump in diameter at a transition between the first sleeve section and the second sleeve section, and this example achieves the advantage of being able to efficiently limit the depth at which the dielectric coupling sleeve is inserted into the conductor cavity of the second electrical conductor when the conductor cavity of the second electrical conductor has a smaller diameter than the first diameter.

According to a second aspect of the disclosure, the task is solved by a high frequency connection adapter comprising: the dielectric coupling sleeve; a first high frequency connector having a housing and a first inner conductor arranged in a receiving section of the housing, wherein the first inner conductor is inserted into the receiving space of the first sleeve section which is closed on one side and wherein the first sleeve section fills at least a portion of the receiving section; a second high frequency connector having a second inner conductor, wherein the second inner conductor comprises a conductor cavity into which the second sleeve section is inserted, and this second aspect achieves the advantage of the respective inner conductors being able to be efficiently capacitively coupled.

The high frequency connection adapter can be a coaxial DC separator such as a coaxial DC Block or an antenna barrier. Further, the high frequency adapter can meet the requirements for use in explosion protection (EX) zones 0, 1, or 2 pursuant to the Betriebssicherheits-Verordnung (industrial safety regulation; BetrSichV) or the Atmosphere Explosible (ATEX) directive.

The respective high frequency connector can be a plug or a socket pursuant to one of the International Electrotechnical Commission (IEC) Type N, Deutsches Institut füNormung (DIN) 7/16, SubMiniature version A (SMA), reverse polarity SMA (RP-SMA), Threaded Neill-Concelman (TNC), IEC Type F, ultra-high frequency (UHF), or Bayonet Neill-Concelman (BNC) standards. Further, the respective inner conductor and/or the housing can be made of brass and/or can be gold-plated. For example, the respective inner conductors are turned parts produced by means of a lathe or milled parts made of brass produced by a milling machine. The respective inner conductors, the housing and/or the dielectric coupling sleeve can furthermore be pressed or bonded together. Further, the conductor cavity of the second inner conductor can have a diameter of 0.5 mm, 1 mm, 4 mm, 5 mm, 8 mm, 10 mm or 15 mm.

In one advantageous example of the high frequency connection adapter, one end of the conductor cavity of the second inner conductor is formed in frustoconical, conical or domed shape, and this example achieves the advantage, that, when an end of the second sleeve section of the dielectric coupling sleeve is of frustoconical, conical or domed shape, the dielectric coupling sleeve can completely fill the conductor cavity of the second inner conductor. For example, the end of the conductor cavity is of frustoconical or conical shape and the aperture angle of the end of the conductor cavity amounts to 35 °, 40 °, 45 °, 50 °, 55 °, 59 °, 60 °, 65 °, 70 °, 75 °, 80° or 85°.

In a further advantageous example of the high frequency connection adapter, the second inner conductor comprises a first inner conductor section, in which the conductor cavity is formed, having a third diameter and a second inner conductor section having a fourth diameter, wherein the fourth diameter is smaller than the third diameter, and this example achieves the advantage of being able to reduce the amount of material needed to manufacture the second inner conductor. For example, the third diameter amounts to 1 mm, 2 mm, 3 mm, 4 mm, 5 mm, 6 mm, 7 mm, 8 mm, 9 mm, 10 mm or 15 mm and the fourth diameter amounts to 0.5 m, 2 mm, 3 mm, 4 mm, 5 mm, 6 mm, 7 mm, 8 mm, 9 mm, 10 mm or 14 mm.

In a further advantageous example of the high frequency connection adapter, the second inner conductor exhibits a jump in diameter at a transition between the first inner conductor section and the second inner conductor section, and this example achieves the advantage of the second inner conductor being able to be manufactured particularly economically.

In a further advantageous example of the high frequency connection adapter, the high frequency connection adapter is designed with an adapter housing, wherein an isolating element is arranged on the adapter housing, this example achieves the advantage of the high frequency connection adapter being able to be used as a control cabinet feedthrough for a coaxial line. For example, the isolating element is formed by a rubber seal ring and the isolating dement is used to seal the control cabinet feedthrough against moisture and/or gases.

In a further advantageous example of the high frequency connection adapter, the high frequency connection adapter is designed with an adapter housing comprising an electroconductive portion, wherein the second high frequency connector has a further housing, and wherein the housing of the first high frequency connector and the further housing of the second high frequency connector are electroconductively connected by the electroconductive portion of the adapter housing, and this example achieves the advantage of enabling a high frequency signal to be efficiently transmitted from the first high frequency connector to the second high frequency connector. According to one example, the adapter housing can be entirely formed from an electrically conductive material such as brass.

In a further advantageous example of the high frequency connection adapter, the adapter housing further comprises a connection for connecting a ground wire, and this example achieves the advantage of being able to ground the outer conductors of the respective high frequency connectors. The connection for connecting the ground wire is for example formed by a screw thread in the electroconductive portion of the adapter housing and by a screw being threaded into the screw thread.

In a further advantageous example of the high frequency connection adapter, the high frequency connection adapter is designed with an adapter housing, wherein the second high frequency connector comprises a further housing, and wherein the housing of the first high frequency connector and/or the further housing of the second high frequency connector can be press-fit to the adapter housing, and this example achieves the advantage of enabling a particularly economical connecting of the first high frequency connector and/or the second first high frequency connector to the adapter housing. For example, the second high frequency connector is a press-in socket.

BRIEF DESCRIPTION OF THE DRAWINGS

Examples of the principles of this disclosure are depicted in the drawings and will be described in greater detail below.

DETAILED DESCRIPTION OF THE INVENTION

Figure 1:
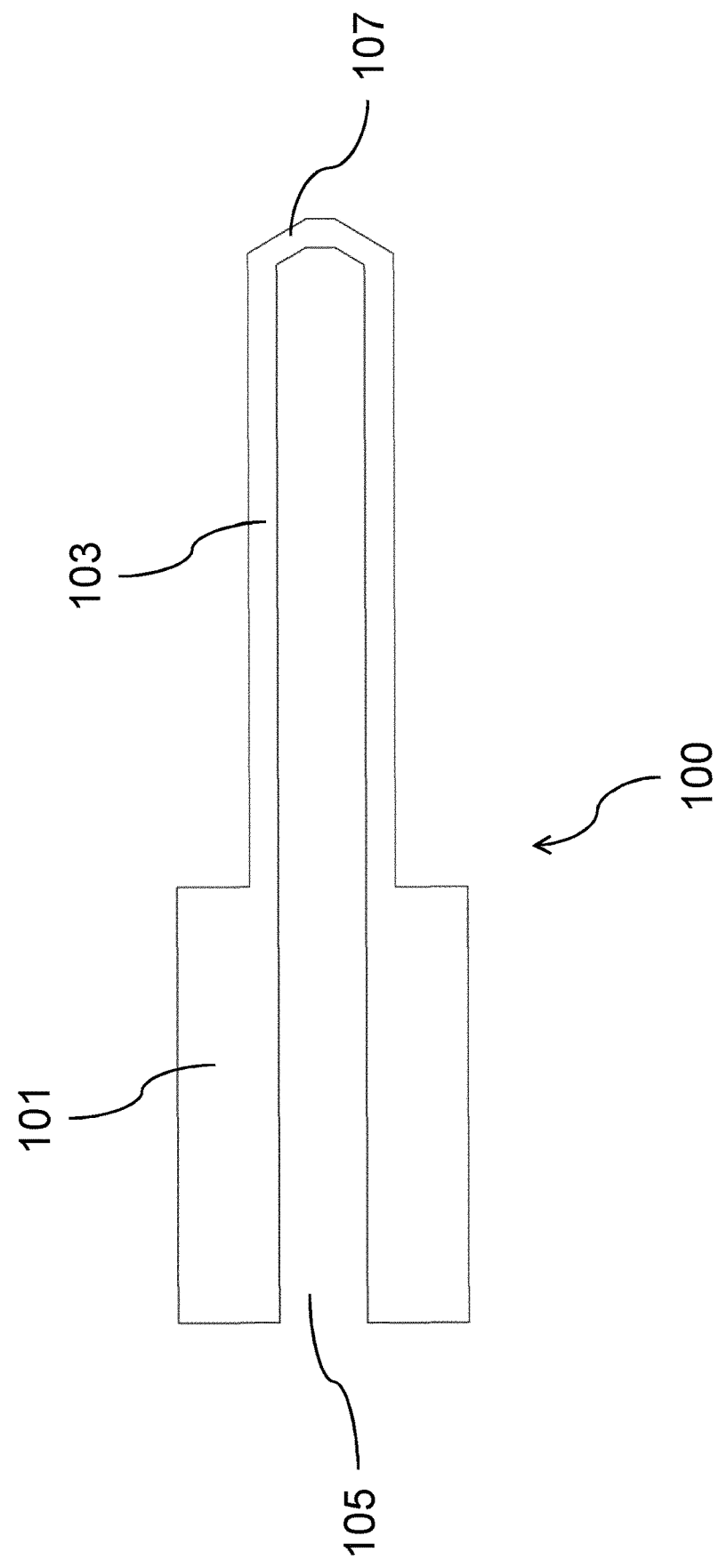
FIG. 1 is a schematic cross-sectional view of a dielectric coupling sleeve according to one example.

FIG. 1 shows a schematic cross-sectional view of a dielectric coupling sleeve 100 according to one example. The dielectric coupling sleeve 100 comprises a first sleeve section 101, a second sleeve section 103, a receiving space 105 and an end 107. The receiving space 105 extends from the first sleeve section 101 into the second sleeve section 103. The end 107 of the second sleeve section 103 is furthermore of frustroconical shape. For example, a length of the first sleeve section 101 amounts to 15 mm, a length of the second sleeve section 103 to 23 mm, a length of the end 107 to 1.6 mm and the aperture angle of the end 107 to 59°.

The dielectric coupling sleeve 100 for the capacitive coupling of a first electrical conductor to a second electrical conductor, wherein the second electrical conductor comprises a conductor cavity, can be configured comprising: the first sleeve section 101 of a first diameter, wherein the receiving space 105 closed on one side into which the first electrical conductor can be inserted is formed in the first sleeve section 101; and the second sleeve section 103 of a second diameter, wherein the second diameter is smaller than the first diameter, and wherein the second sleeve section 103 can be inserted into the conductor cavity.

The dielectric coupling sleeve 100 can be formed from a dielectric material such as polytetrafluoroethylene (PTFE), polyethylene (PE), polyamide (PA) or ceramic. For example, the dielectric coupling sleeve 100 is a turned part produced by means of a lathe or a milled part made of Teflon or a Teflon isolator produced by a milling machine. The respective sleeve section 101, 103 and/or the receiving space 105 closed on one side can furthermore have a cylindrical shape, in particular a circular cylindrical shape. For example, the first diameter amounts to 1 mm, 5 mm, 10 mm, 15 mm or 20 mm, the second diameter to 0.5 mm, 1 mm, 3 mm, 5 mm, 8 mm, 10 mm or 15 mm, and the diameter of the receiving space 105 closed on one side to 0.5 mm, 1 mm, 3 mm, 5 mm, 8 mm, 10 mm or 15 mm. A length of the respective sleeve section 101, 103 can furthermore amount to 5 mm, 10 mm, 15 mm, 20 mm, 25 mm, 30 mm or 40 mm.

The respective electrical conductor can in each case be an inner conductor of a respective high frequency connector such as a N-type connector or an SMA-type connector. The respective electrical conductor and dielectric coupling sleeve 101 can furthermore be pressed or bonded together.

Figure 2:
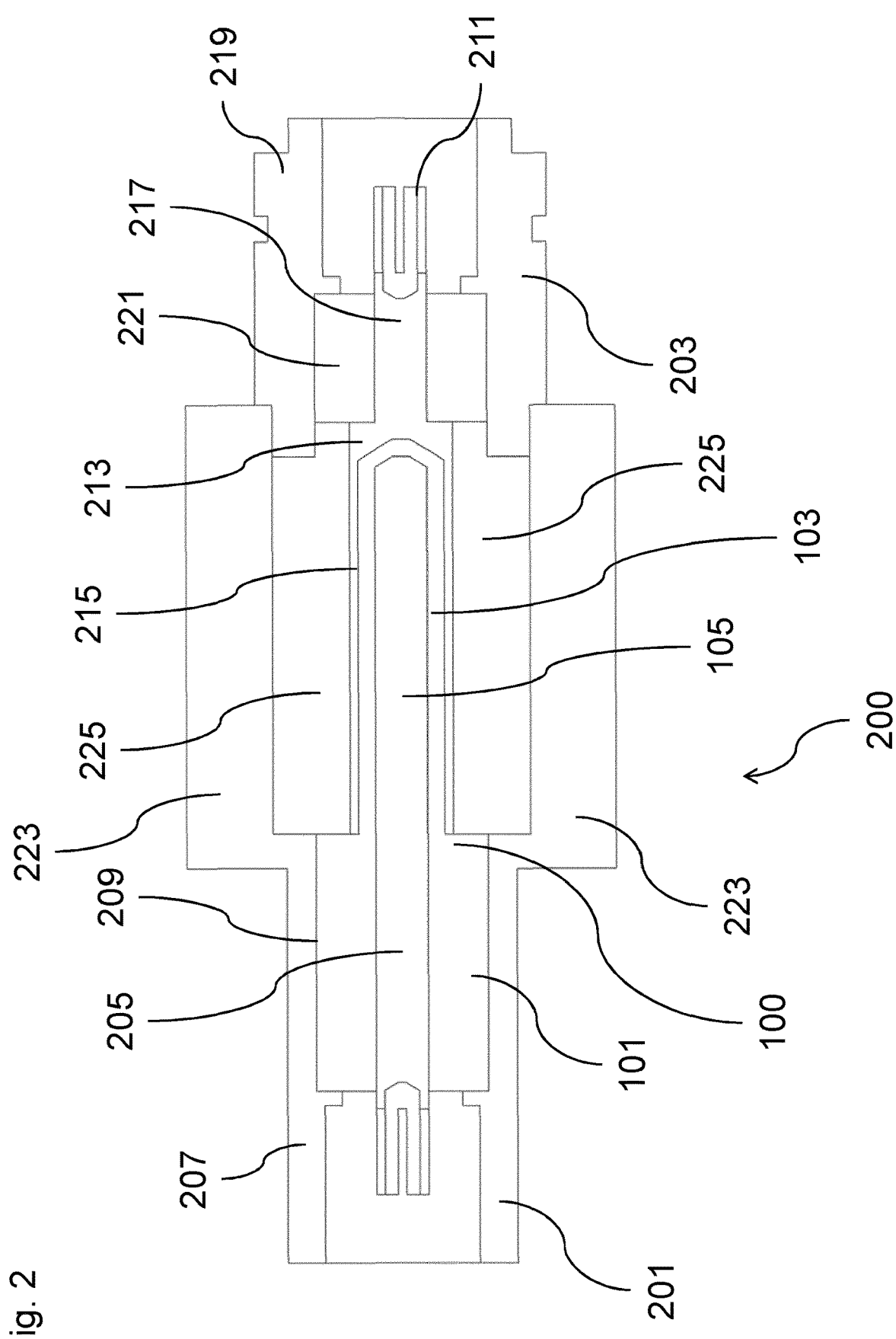
FIG. 2 is a schematic cross-sectional view of a high frequency connection adapter according to one example.

FIG. 2 shows a schematic cross-sectional view of a high frequency connection adapter 200 according to one example. The high frequency connection adapter 200 comprises the dielectric coupling sleeve 100, a first high frequency connector 201 and a second high frequency connector 203. The respective high frequency connectors 201, 203 are formed by N-type connectors. The first high frequency connector 201 comprises a first inner conductor 205 and a housing 207 having a receiving section 209. The first sleeve section 101 of the dielectric coupling sleeve 100 is thereby received in the receiving section 209. The first inner conductor 205 is furthermore partly inserted into the receiving space 105 closed on one side. The second high frequency connector 203 comprises a second inner conductor 211 having a first inner conductor section 213 with a conductor cavity 215 and a second inner conductor section 217, a further housing 219 and an isolating element 221 which galvanically isolates the second inner conductor section 217 and the further housing 219. The second sleeve section 103 of the dielectric coupling sleeve 100 is furthermore inserted into the conductor cavity 215. The high frequency connection adapter 200 further comprises an adapter housing 223 and an empty space 225. Furthermore, the further housing 219 is pressed into the adapter housing 223.

For example, a length of the first inner conductor 205 amounts to 43 mm, a length of the first inner conductor section 213 to 24 m, a length of the conductor cavity 215 to 23 mm., a length of the second inner conductor section 217 to 13.7 mm, a diameter of the first inner conductor section 213 to 6 mm, a diameter of the conductor cavity 215 to 5 mm and a diameter of the second inner conductor section 217 to 3 mm. The isolating element 221 can furthermore be formed from a dielectric material such as polytetrafluoroethylene (PTFE), polyethylene (PE), polyamide (PA) or ceramic.

The high frequency connection adapter 200 can be designed comprising: the dielectric coupling sleeve 100; the first high frequency connector 201 having the housing 207 and the first inner conductor 205 arranged in the receiving section 209 of the housing 207, wherein the first inner conductor 205 is inserted into the receiving space 105 of the first sleeve section 101 closed on one side and wherein the first sleeve section 101 fills at least a portion of the receiving section 209; the second high frequency connector 203 having the second inner conductor 211, wherein the second inner conductor 211 comprises a conductor cavity 215 into which the second sleeve section 103 is inserted.

The high frequency connection adapter 200 can be a coaxial DC separator such as a coaxial DC Block or an antenna barrier. Furthermore the high frequency adapter 200 can meet the requirements for use in EX zones 0, 1, or 2 pursuant to the Betriebs-Sicherheitsverordnung (industrial safety regulation; BetrSichV) or the Atmosphère Explosible (ATEX) directive.

The respective high frequency connector 200 can be a plug or a socket pursuant to one of the TEC Type N, DIN 7/16, SMA, RP-SMA, TNC, IEC Type F, UHF, or BNC standards. Further, the respective inner conductor 205, 211 and/or the housing 207 can be made of brass and/or can be gold-plated. For example, the respective inner conductors 205, 211 are turned parts produced by means of a lathe or milled parts made of brass produced by a milling machine. The respective inner conductors 205, 211, the housing 207 and/or the dielectric coupling sleeve 100 can furthermore be pressed or bonded together. Further, the conductor cavity 215 of the second inner conductor 211 can have a diameter of 0.5 mm, 1 mm, 4 mm, 5 mm, 8 mm, 10 mm or 15 mm.

According to one example, the high frequency connection adapter 200 can be easily and quickly produced by plugging and press-fitting together.

According to a further example, potting of the empty space 225, for example with a dielectric material, can be dispensed with.

According to a further example, the high frequency connection adapter 200 can be used as a control cabinet feedthrough in an exterior area. A rubber seal ring can thereby be arranged on the high frequency connection adapter 200 so as to meet the requirements of the International Protection 54 (IP54) protection rating.

According to a further example, the high frequency connection adapter 200 can be designed to transmit high frequency signals in the frequency range of 700 MHz to 6 GHz at 1 W power. The high frequency connection adapter 200 can further have an insulation withstand voltage value of 375V or 265V alternating voltage in order to meet the Deutsches Institut für Normung (DIN)/European Standards (EN) 60079-11:2012standard. Further, attenuation of a high frequency signal transmitted via the high frequency connection adapter 200 can amount to less than 0.6 dB at 868 MHz and/or less than 0.5 dB at 2.4 GHz. Further, the high frequency connection adapter 200 can have impedance of 50Ωand can be used in a temperature range of −40° C. to 85° C. or a temperature range of −40° C. to 75° C.

According to a further example, the empty space 225 can have a height of at least 6 mm or of at least 10 mm. The dielectric coupling sleeve 100 can furthermore exhibit a material thickness of at least 1 mm and a leakage resistance value of 175 Comparative Tracking Index (CTI).

Figure 3:
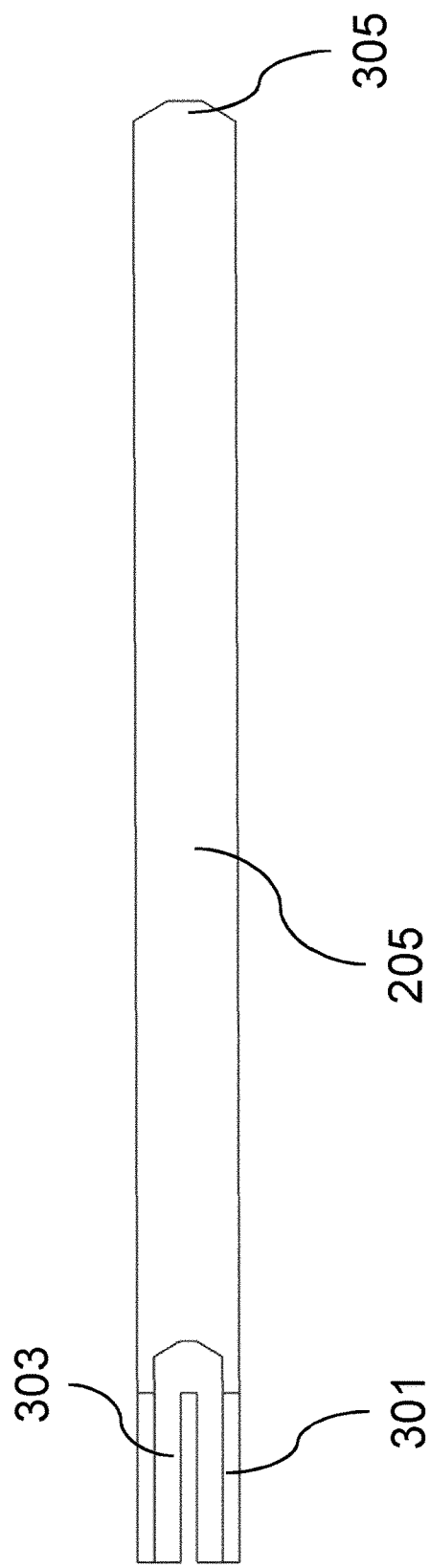
FIG. 3 is a schematic cross-sectional view of the first inner conductor.

FIG. 3 shows a schematic cross-sectional view of the first inner conductor 205. The first inner conductor 205 exhibits a contact end 301 having a recess 303 and a frustoconical insertion end 305. By means of the contact end 301, an inner conductor of a further high frequency connector connected to the first high frequency connector 201 can be contacted. The inner conductor of the further high frequency connector can thereto be inserted into the recess 303 to establish electrical contact with the first inner conductor 205. The frustoconical insertion end 305 can furthermore he inserted into the receiving space 105 of the dielectric coupling sleeve 100.

Figure 4:
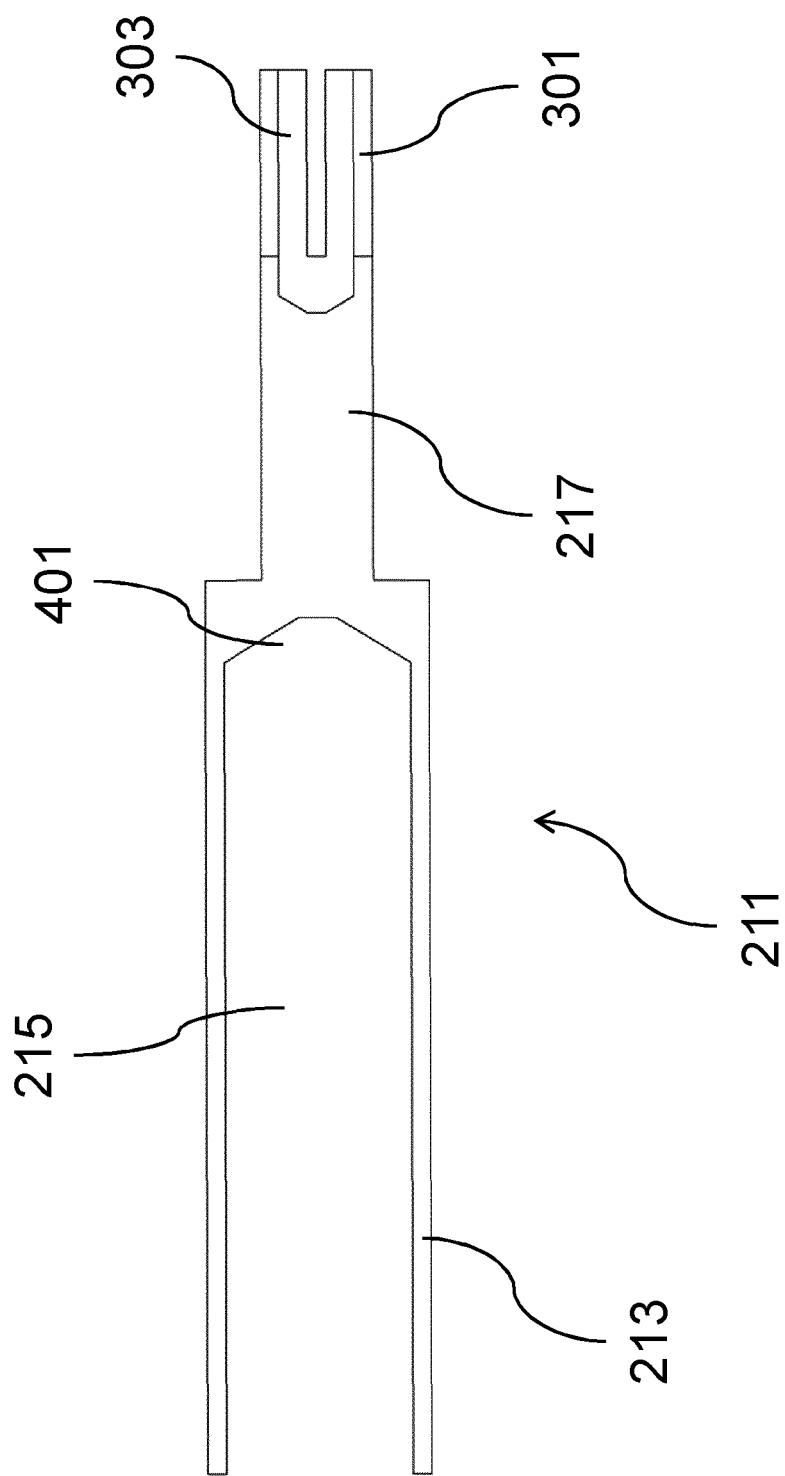
FIG. 4 is a schematic cross-sectional view of the second inner conductor.

FIG. 4 shows a schematic cross-sectional view of the second inner conductor 211. The second inner conductor 211 comprises the first inner conductor section 213, the conductor cavity 215 with a frustoconical end 401, the second inner conductor section 217 and a contact end 301 having a recess 303. The aperture angle of the frustoconical end 401 amounts for example to 59°.

Figure 5:
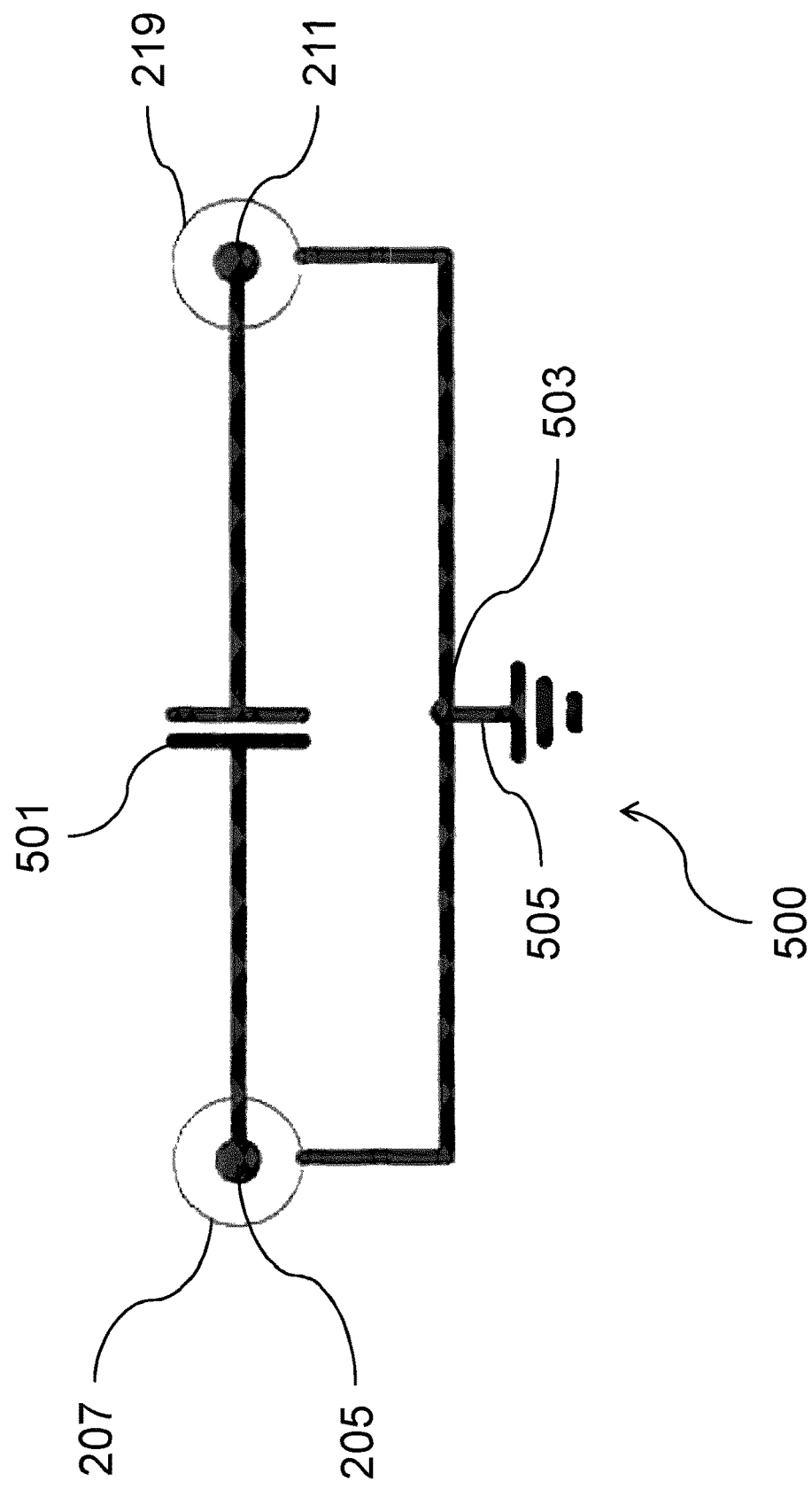
FIG. 5 is a schematic equivalent circuit diagram of the high frequency connection adapter.

FIG. 5 shows a schematic equivalent circuit diagram 500 of the high frequency connection adapter 200 of FIG. 2 The equivalent circuit diagram 500 depicts the first inner conductor 205, the housing 207, the second inner conductor 211, the further housing 219, a capacitor 501 and a connection 503 to which a ground wire 505 is connected. The respective inner conductors 205, 211 are capacitively coupled via the capacitor 501. Further, the housing 207 and the further housing 219 are grounded by the ground wire 505. The capacitor 501 is thereby formed by the arrangement of the dielectric coupling sleeve 100 with the respective inner conductors 205, 211. The capacitance of the capacitor 510 is for example 1 pF, 5 pF, 10 pF, 15 pF, 20 pF 25 pF, 30 pF, 35 pF, 40 pF, 45 pF or 50 pF.

According to a further example, the high frequency connection adapter 200 can be manufactured without soldering and/or without using a circuit board design.

According to a further example, a high frequency output of a radio module can be rendered intrinsically safe by the high frequency connection adapter 200 such as an antenna barrier.

According to a further example, the high frequency connection adapter 200 can meet the requirements pursuant to the Appareils destinés àêtre utilizéen Atmosphères Explosives (ATEX) Product Directive 94/9/EG, DIN EN 60079-11, ATEX/International Electrotechnical Commission System for Certification to Standards Relating to Equipment for Use in Explosive Atmospheres (IECEx) II 2 (1) G Ex [ia] IIC Ga, and/or ATEX/IECEx II 2 (1) G Ex nA [iaGa] IIC T6 Gc standards.

All of the features described and shown in connection with individual examples of the disclosure can be provided in different combinations in the inventive subject matter so as to realize their advantageous effects simultaneously.

LIST OF REFERENCE NUMBERS 100 dielectric coupling sleeve
101 first sleeve section
103 second sleeve section
105 receiving space
107 end
200 high frequency connection adapter
201 first high frequency connector
203 second high frequency connector
205 first inner conductor
207 housing
209 receiving section
211 second inner conductor
213 first inner conductor section
215 conductor cavity
217 second inner conductor section
219 further housing
221 isolating element
223 adapter housing
225 empty space
301 contact end
303 recess
305 insertion end
401 end
500 equivalent circuit diagram
501 capacitor
503 connection
505 ground wire

What is claimed is:

1. A high frequency connection adapter comprising:
a dielectric coupling sleeve comprising a first sleeve section and a second sleeve section;
a first high frequency connector having a first housing and a first inner conductor arranged in a receiving space of the first housing, wherein the first inner conductor is inserted into a receiving space of the first sleeve section and the second sleeve section of the dielectric coupling sleeve, wherein the second sleeve section is closed on one side and fills at least a portion of the receiving space of the first housing, and wherein the receiving space extends at least partly into the second sleeve section, wherein the first electrical conductor is retained in the receiving space closed on the one side by a first frictional connection;
a second high frequency connector having a second inner conductor and a second housing, wherein the second inner conductor comprises a conductor cavity into which the second sleeve section of the dielectric coupling sleeve is inserted, and wherein the second sleeve section is retained in the conductor cavity by a second frictional connection; and
an isolating element configured to galvanically isolate the second inner conductor and the second housing.

2. The high frequency connection adapter according to claim 1, wherein the isolating element comprises a dielectric material selected from the group consisting of: polytetrafluoroethylene (PTFE), polyethylene (PE), polyamide (PA), and a ceramic.

3. The high frequency connection adapter according to claim 1, further comprising:
an adapter housing comprising an electroconductive portion, wherein the first housing and the second housing are electroconductively connected by the electroconductive portion of the adapter housing.

4. The high frequency connection adapter according to claim 3, wherein the adapter housing further comprises:
a connection for connecting a ground wire.

5. The high frequency connection adapter according to claim 1, wherein the first inner conductor further comprises:
a first end that comprises a recess; and
an second end configured to enter the receiving space of the dielectric coupling sleeve.

6. The high frequency connection adapter according to claim 1, further comprising:
an adapter housing, wherein the first housing or the second housing is press-fit to the adapter housing.

7. The high frequency connection adapter according to claim 6, further comprising a rubber seal ring arranged on the adapter housing.

8. The high frequency connection adapter according to claim 1, wherein the second inner conductor further comprises:
   a first inner conductor section, in which the conductor cavity is formed, fire first inner conductor section having a third outer diameter; and
   a second inner conductor section having a fourth outer diameter, wherein the fourth outer diameter is smaller than the third outer diameter.

9. The high frequency connection adapter according to claim 8, wherein the second inner conductor exhibits a jump in outer diameter at a transition between the first inner conductor section and the second inner conductor section.

10. The high frequency connection adapter according to claim 1, wherein one end of the conductor cavity of the second inner conductor is formed in one of: a frustoconical shape, a conical shape, or a domed shape.

\* \* \* \* \*